United States Patent
Abdelhalem et al.

(10) Patent No.: US 9,800,273 B1
(45) Date of Patent: Oct. 24, 2017

(54) WIDEBAND HIGH LINEARITY LNA WITH INTRA-BAND CARRIER AGGREGATION SUPPORT

(71) Applicant: QUALCOMM Incorporated, San Diego, CA (US)

(72) Inventors: Sherif Abdelhalem, San Diego, CA (US); Bassel Hanafi, San Diego, CA (US); Hasnain Lakdawala, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/446,847

(22) Filed: Mar. 1, 2017

(51) Int. Cl.
| | |
|---|---|
| H04B 1/16 | (2006.01) |
| H03F 3/19 | (2006.01) |
| H04B 1/04 | (2006.01) |
| H03F 3/195 | (2006.01) |
| H03F 3/24 | (2006.01) |

(52) U.S. Cl.
CPC .......... *H04B 1/0458* (2013.01); *H03F 3/195* (2013.01); *H03F 3/245* (2013.01); *H04B 1/0475* (2013.01); *H03F 2200/165* (2013.01); *H03F 2200/294* (2013.01); *H03F 2200/451* (2013.01)

(58) Field of Classification Search
CPC ...... H04B 1/16; H04B 1/0075; H04B 1/0458; H04B 1/0475; H04B 1/3805; H03F 1/201; H03F 3/19; H03F 3/193; H03F 3/195; H03F 3/211; H03F 3/245; H03F 2200/165; H03F 2200/451; H03F 2200/294
See application file for complete search history.

(56) References Cited

U.S. PATENT DOCUMENTS

| | | | |
|---|---|---|---|
| 8,903,343 B2 | 12/2014 | Holenstein et al. | |
| 8,975,968 B2 | 3/2015 | Abdelhalem et al. | |

(Continued)

FOREIGN PATENT DOCUMENTS

CN 104779919 A 7/2015

OTHER PUBLICATIONS

Xiaoyong Li; Shekhar, S.; Allstot, D.J., "Gm-boosted common-gate LNA and differential colpitts VCO/QVCO in 0.18-m CMOS," in IEEE Journal of Solid-State Circuits, vol. 40, No. 12, pp. 2609-2619, Dec. 2005.

(Continued)

*Primary Examiner* — Thanh Le
(74) *Attorney, Agent, or Firm* — Procopio, Cory, Hargreaves

(57) ABSTRACT

A device and method for amplifying signals is provided. The device can have an input to receive an input signal having a first desired signal on a first carrier, a second desired signal on a second carrier, and one or more interfering signals. The device can have a first carrier aggregation (CA) chain for use with the first desired signal and a second CA chain for use with the second desired signal. The first and second CA chains can be coupled to the input. The first and second CA chains can have a plurality of transconductance stages. Each of the transconductance stages can be configured as a high impedance stage or a low impedance stage. The transconductance stages can be selectively activated to incrementally adjust the transconductance, and therefore the input impedance, of each of the CA chains.

30 Claims, 9 Drawing Sheets

(56) References Cited

U.S. PATENT DOCUMENTS

| | | | |
|---|---|---|---|
| 9,059,665 B2 | 6/2015 | Youssef et al. | |
| 9,154,087 B2 | 10/2015 | Jin | |
| 9,154,356 B2 | 10/2015 | Tasic et al. | |
| 9,154,357 B2 | 10/2015 | Tasic et al. | |
| 9,160,598 B2 | 10/2015 | Davierwalla et al. | |
| 9,166,852 B2 | 10/2015 | Davierwalla et al. | |
| 9,413,296 B2 | 8/2016 | Lu et al. | |
| 9,426,785 B2 | 8/2016 | Piipponen et al. | |
| 9,467,104 B2 | 10/2016 | Xu et al. | |
| 9,479,131 B2 | 10/2016 | Youssef et al. | |
| 9,543,903 B2 | 1/2017 | Xu et al. | |
| 2012/0327825 A1* | 12/2012 | Gudem | H04B 1/3805 370/310 |
| 2013/0136211 A1* | 5/2013 | Jussila | H04B 1/0075 375/340 |
| 2013/0315348 A1 | 11/2013 | Tasic et al. | |
| 2014/0134960 A1 | 5/2014 | Tasic et al. | |
| 2014/0240048 A1 | 8/2014 | Youssef et al. | |
| 2015/0236736 A1* | 8/2015 | Murphy | H04B 1/1081 455/305 |
| 2015/0237583 A1* | 8/2015 | Hassan | H04B 1/40 455/552.1 |
| 2015/0351131 A1 | 12/2015 | Woo et al. | |
| 2016/0173042 A1* | 6/2016 | Abdelhalem | H03F 3/193 330/296 |
| 2016/0248390 A1 | 8/2016 | Issakov et al. | |
| 2016/0269042 A1* | 9/2016 | Jabbour | H03M 3/406 |
| 2017/0093343 A1 | 3/2017 | Xu et al. | |

OTHER PUBLICATIONS

Fabiano, I.; Sosio, M.; Liscidini, A.; Castello, R., "SAW-Less Analog Front-End Receivers for TDD and FDD," in IEEE Journal of Solid-State Circuits, vol. 48, No. 12, pp. 3067-3079, Dec. 2013.

* cited by examiner

WIDEBAND HIGH LINEARITY LNA WITH INTRA-BAND CARRIER AGGREGATION SUPPORT

BACKGROUND

Technological Field

This disclosure relates to radio frequency (RF) circuits and circuit design. More particularly, this disclosure relates to a low noise amplifier (LNA) within RF transceiver.

Related Art

A wireless device (e.g., a cellular phone or a smartphone) in a wireless communication system can transmit and receive data for two-way communication. The wireless device can include a transmitter for data transmission and a receiver for data reception. For data transmission, the transmitter may modulate a radio frequency (RF) carrier signal with data to obtain a modulated signal, amplify the modulated signal to obtain an output RF signal having the proper transmit power level, and transmit the output RF signal via an antenna to a base station. For data reception, the receiver can obtain a received RF signal via the antenna and may amplify and process the received RF signal to recover data sent by the base station.

A wireless device can have amplifiers of different types for different purposes. For example, a wireless device may include a low noise amplifier (LNA) in a receiver, a driver amplifier (DA) and a power amplifier (PA) in a transmitter, and a variable gain amplifier (VGA) in the receiver and/or transmitter. The wireless device can have multiple amplifiers having outputs coupled together, with each amplifier being either enabled to provide an output signal or disabled to provide no output signal.

SUMMARY

An aspect of the disclosure provides a device for amplifying signals. The device can have an amplifier input operable to receive an input signal. The device can have a first carrier aggregation (CA) chain comprising a first plurality of transconductance stages having shared inputs coupled to the amplifier input. The first plurality of transconductance stages comprising at least a high impedance stage and a low impedance stage. The device can have a first CA output coupled to shared outputs of the first plurality of transconductance stages. The device can have a second CA chain comprising a second plurality of transconductance stages having shared inputs coupled to the amplifier input. The second plurality of transconductance stages can have at least a high impedance stage and a low impedance stage. The device can have a second CA output coupled to shared outputs of the second plurality of transconductance stages.

Another aspect of the disclosure provides a method for amplifying signals. The method can include receiving, at an amplifier input, an input signal having a first desired signal on a first carrier and a second desired signal on a second carrier. The method can also include first activating, by a controller, one or more transconductance stages of a first plurality of transconductance stages in a first carrier aggregation (CA) chain for use with the first carrier. The method can also include second activating, by the controller, one or more transconductance stages of a second plurality of transconductance stages in a second carrier aggregation (CA) chain for use with the second carrier. The method can also include outputting at a first CA output coupled to the first CA chain, the first desired signal. The method can also include outputting at a second CA output coupled to the second CA chain, the second desired signal.

Another aspect of the disclosure provides an apparatus amplifying signals. The apparatus can have means for receiving an input signal having a first desired signal on a first carrier and a second desired signal on a second carrier. The apparatus can also have means for selectively activating one or more transconductance stages of a first plurality of transconductance stages in a first carrier aggregation (CA) chain for use with the first carrier and one or more transconductance stages of a second plurality of transconductance stages in a second CA chain for use with the second carrier. The apparatus can also have means for matching, based on the means for selectively activating, an input impedance of the first CA chain and the second CA chain. The apparatus can also have means for providing the first desired signal based on the means for matching. The apparatus can also have means for providing the second desired signal based on the means for matching.

Another aspect of the disclosure provides a device for amplifying a first desired signal and a second desired signal. The device can have an input configured to receive a frequency band having the first desired signal and the second desired signal. The device can also have a plurality of transconductance stages arranged in a first CA chain and a second CA chain. Each transconductance stage of the plurality of transconductance stages can have a pair of transistors. Each transistor of the pair of transistors can have a gate coupled to the input, and a drain. The drain of each transistor in each transconductance stage of the first CA chain can be coupled to a first CA output. The drain of each transistor in each transconductance stage of the second CA chain can be coupled to a second CA output. The device can also have a controller coupled to each transconductance stage of the plurality of transconductance stages. The controller can match an input impedance of each of the first CA chain and the second CA chain based on selectively activating and deactivating one or more of the plurality of transconductance stages, wherein each transconductance stage is configured as one of high impedance and low impedance.

Other features and advantages of the disclosure will be apparent with a review of the following description and accompanying figures.

BRIEF DESCRIPTION OF THE DRAWINGS

The details of embodiments of the present disclosure, both as to their structure and operation, may be gleaned in part by study of the accompanying drawings, in which like reference numerals refer to like parts, and in which.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Wideband, high linearity LNAs capable of supporting intra-band carrier aggregation are disclosed herein. These amplifiers may be used for various electronic devices such as wireless communication devices (e.g., cellular phones, smartphones, etc.), tablets, personal digital assistants (PDAs), handheld devices, wireless modems, laptop computers, smartbooks, netbooks, cordless phones, wireless local loop (WLL) stations, Bluetooth devices, consumer electronic devices, etc. For clarity, the use of amplifiers in a wireless communication device is described below.

Figure 1:
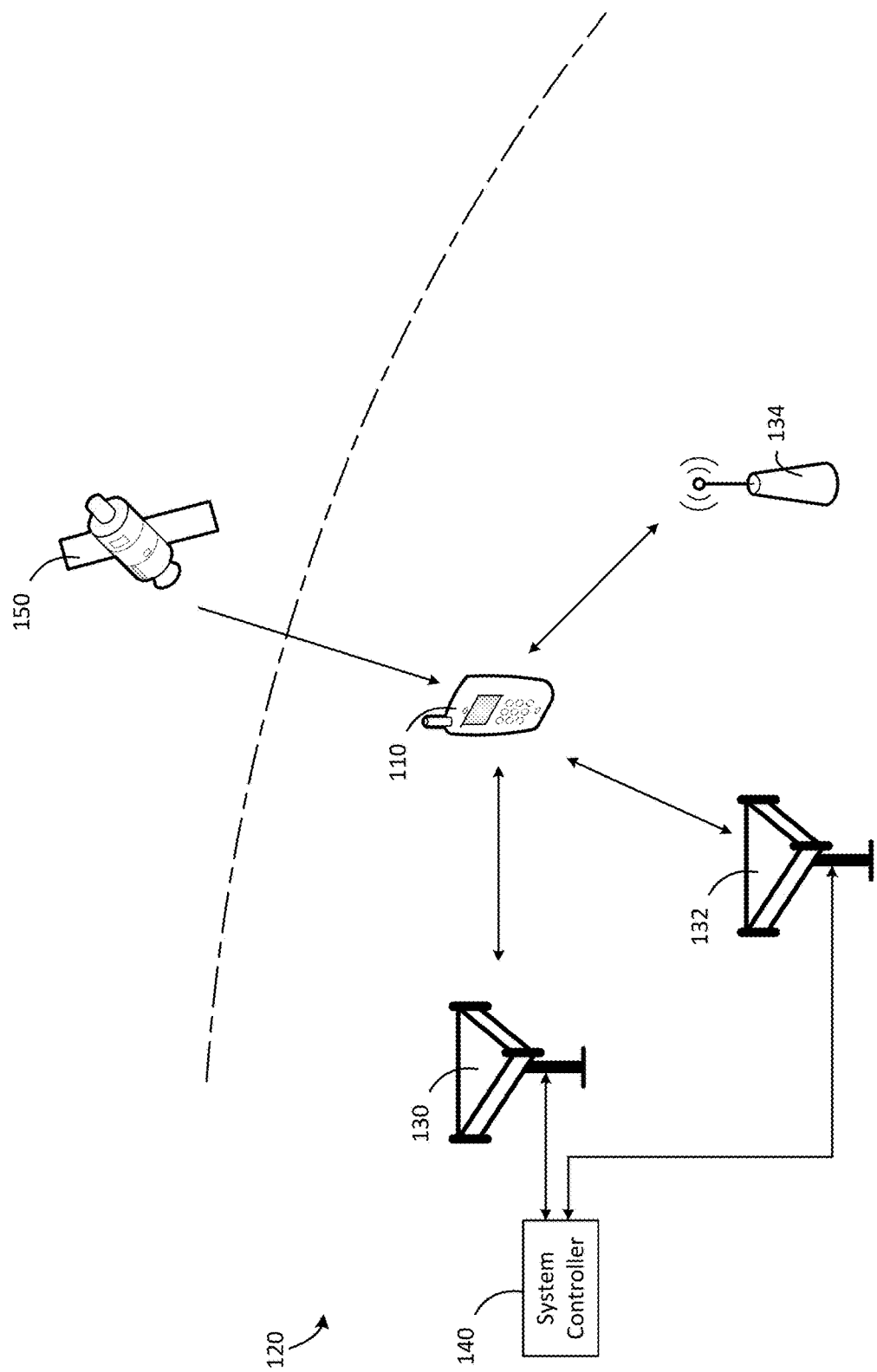
FIG. 1 is a graphical representation of a wireless communication system.

FIG. 1 is a graphical representation of a wireless communication system. A wireless communication system (system) 120 can have a wireless device (device) 110. The system 120 can be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Time Division Synchronous CDMA (TD-SCDMA), or some other version of CDMA. For simplicity, FIG. 1 depicts the system 120 having a base station 130, a base station 132, a base station 134, and a system controller 140. In general, a wireless system (e.g., the system 120) can have any number of base stations and any set of network entities. A base station may also be referred to as a Node B, an evolved Node B (eNB), an access point, etc.

The device 110 may also be referred to herein as a user equipment (UE), a mobile station, a terminal, an access terminal, a subscriber unit, a station, etc. The device 110 can be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The device 110 may communicate with wireless system 120. The device 110 may also receive signals from broadcast stations, signals from satellites (e.g., a satellite 150) in one or more global navigation satellite systems (GNSS), etc. The device 110 may support one or more radio technologies for wireless communication such as LTE, WCDMA, CDMA 1x, TD-SCDMA, GSM, 802.11, etc.

The device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

The device 110 may support carrier aggregation (CA), which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to five carriers in one or two bands in LTE Release 11.

In general, CA may be categorized into two types: intra-band CA and inter-band CA. Intra-band CA refers to operation on multiple carriers within the same band. Inter-band CA refers to operation on multiple carriers in different bands.

Figure 2:
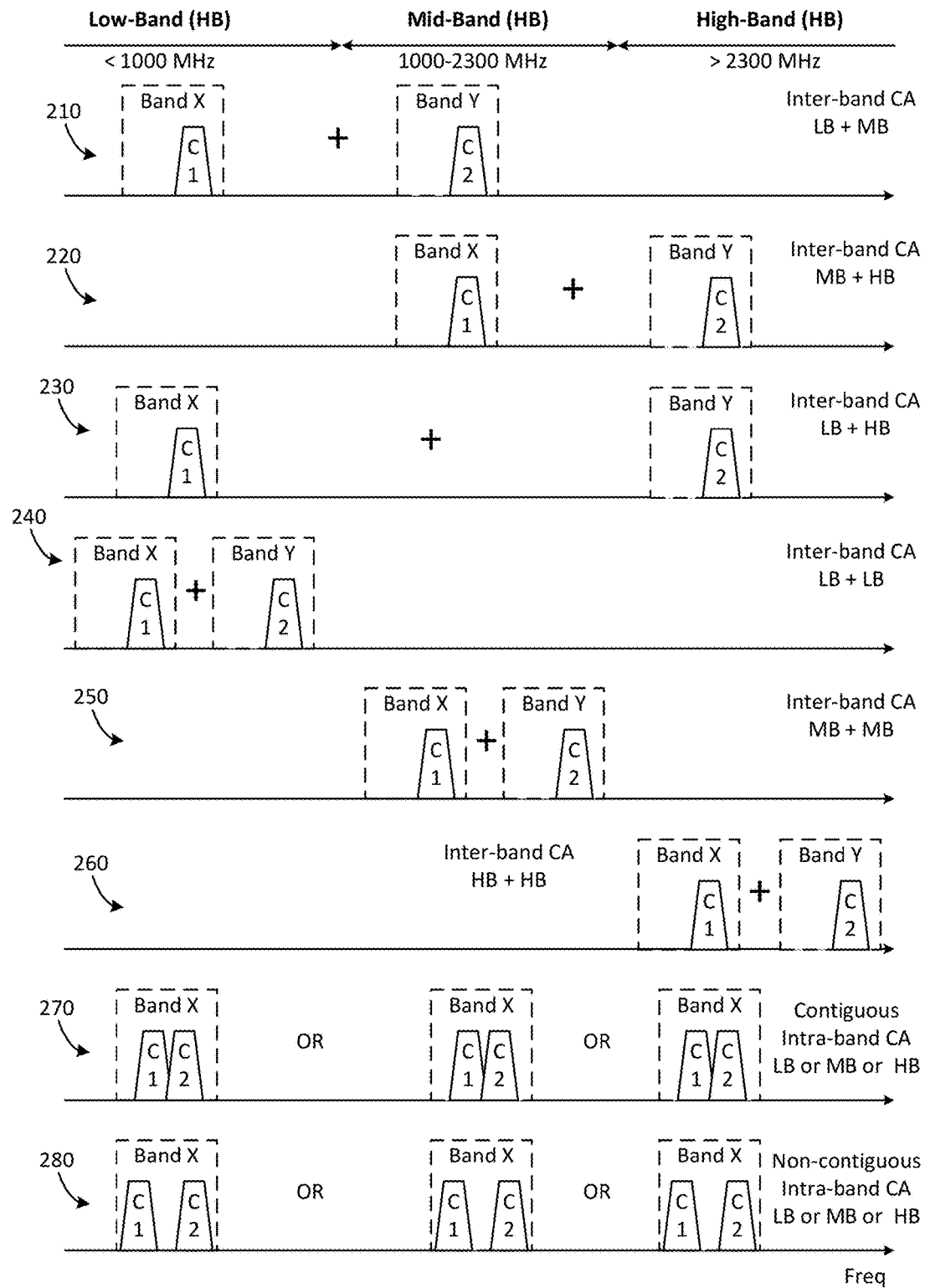
FIG. 2 is a graphical representation of various carrier aggregation scenarios that can be supported by the device of FIG. 1.

FIG. 2 is a graphical representation of various carrier aggregation scenarios that can be supported by the device of FIG. 1. For simplicity, FIG. 2 shows the device 110 configured with only one carrier in a band for inter-band CA. In general, wireless device 110 may be configured with one or more carriers in a given band.

A scenario 210 covers inter-band CA with one carrier C1 in band X in low-band and one carrier C2 in band Y in mid-band being configured for the device 110. A scenario 220 covers inter-band CA with one carrier C1 in band X in mid-band and one carrier C2 in band Y in high-band being configured for wireless device 110. A scenario 230 covers inter-band CA with one carrier C1 in band X in low-band and one carrier C2 in band Y in high-band being configured for the device 110.

A scenario 240 covers inter-band CA with one carrier C1 in band X in low-band and one carrier C2 in band Y also in low-band being configured for the device 110. A scenario 250 covers inter-band CA with one carrier C1 in band X in mid-band and one carrier C2 in band Y also in mid-band being configured for the device 110. Scenario 260 covers inter-band CA with one carrier C1 in band X in high-band and one carrier C2 in band Y also in high-band being configured for the device 110.

A scenario 270 covers contiguous intra-band CA with two adjacent carriers C1 and C2 in band X in low-band, or mid-band, or high-band being configured for the device 110. Scenario 280 covers non-contiguous intra-band CA with two non-adjacent carriers C1 and C2 in band X in low-band, or mid-band, or high-band being configured for the device 110.

FIG. 2 further depicts some examples of carrier aggregation. Carrier aggregation may also be supported for other combinations of bands and band groups. The device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by different wireless systems for concurrent voice/data, or data/data, or voice/voice, etc.

Figure 3:
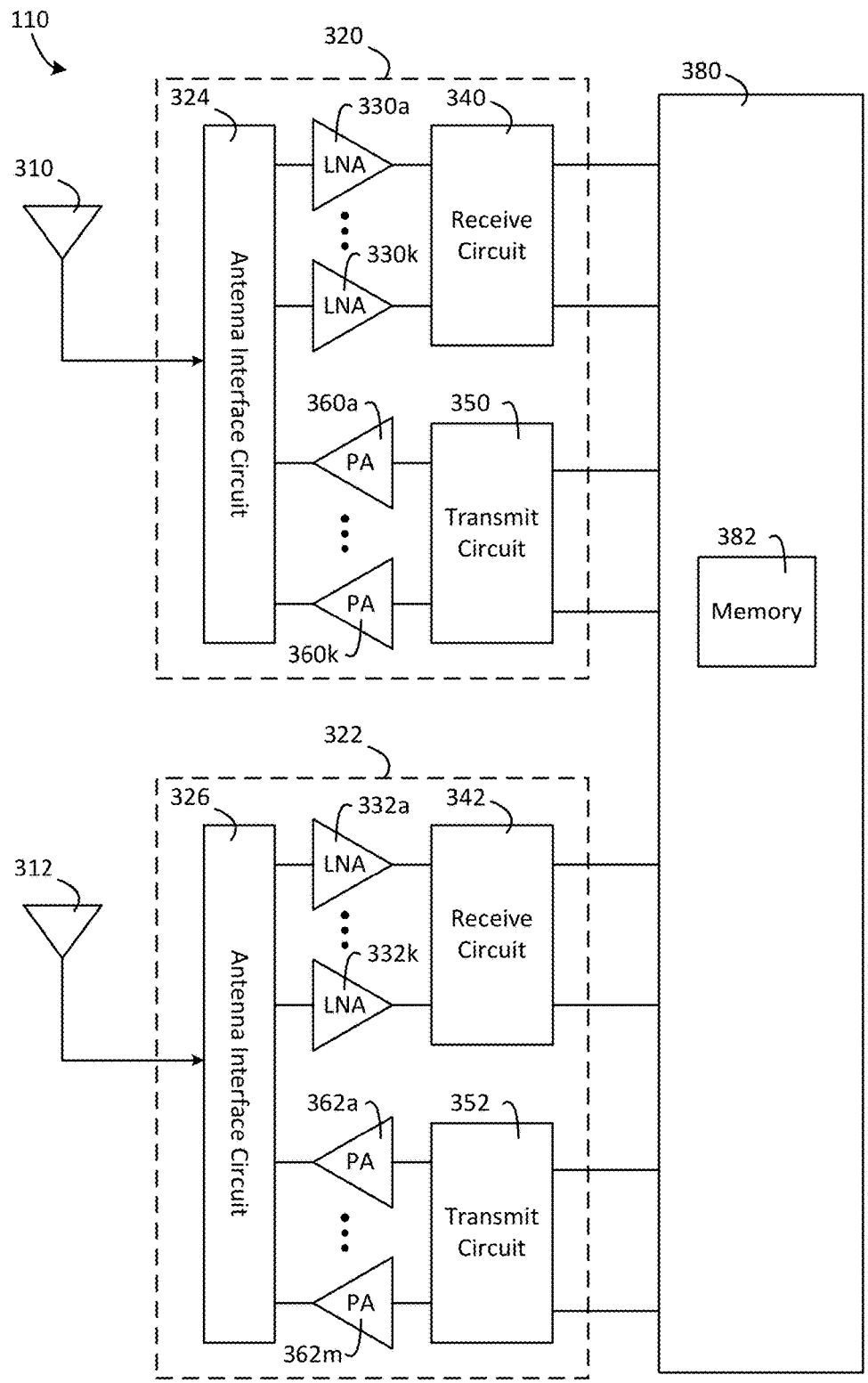
FIG. 3 is a functional block diagram of an embodiments of the device of FIG. 1.

FIG. 3 is a functional block diagram of an embodiment of the device of FIG. 1. In this exemplary design, the device 110 can have a transceiver 320 coupled to a primary antenna 310. The device 110 can also have a transceiver 322 coupled to a secondary antenna 312. The device 110 can also have a controller 380. The controller 380 can have one or more processors or microprocessors. The controller 380 can further be a central processing unit (CPU) operable to control the overall functions of the device 110.

The transceiver 320 can have an antenna interface circuit 324 coupled to LNAs 330a-330k (collectively referred to herein as LNAs 330). The transceiver 320 can also have a receive circuit 340 coupling the LNAs 330 to the controller 380. The receive circuit 340 can be one or more receive circuits.

The transceiver 320 can also have a transmit circuit 350 coupled to the controller 380. The transmit circuit 350 can further couple power amplifiers (PAs) 360a-360k (collectively referred to herein as PAs 360). The PAs 360 can further be coupled to the antenna interface circuit 324.

The transceiver 322 can have an antenna interface circuit 326 coupled to LNAs 332a-332k (collectively referred to herein as LNAs 332). The transceiver 322 can also have a receive circuit 342 coupling the LNAs 332 to the controller 380. The receive circuit 342 can also be one or more receive circuits, similar to the receive circuit 340.

The transceiver 322 can also have a transmit circuit 352 coupled to the controller 380. The transmit circuit 352 can further couple power amplifiers (PAs) 362a-362k (collectively referred to herein as PAs 362). The PAs 362 can further be coupled to the antenna interface circuit 326.

The transceiver 320 and the transceiver 322 can support multiple frequency bands, carrier aggregation, multiple radio technologies, multiple wireless systems, receive diversity, multiple-input multiple-output (MIMO) transmission from multiple transmit antennas to multiple receive antennas, etc.

For data reception, the antenna 310 can receive signals from one or more base stations and/or other transmitter stations and provides a received RF signal, which is routed through antenna interface circuit 324. The signal(s) can be provided as an input RF signal to a selected LNA 330. The antenna interface circuit 324 can have a variety of switches, duplexers, diplexers, transmit filters, receive filters, matching circuits, etc. The selected LNA 330 can amplify the input RF signal and provide one or more amplified RF signals to the receive circuit 340. The receive circuit 340 can down-convert each amplified RF signal from RF to baseband, filter and amplify the downconverted signal, and provide an input baseband signal to the controller 380. The receive circuit 340 can have a variety of mixers, filters, amplifiers, matching circuits, oscillators, local oscillator (LO) generators, phase locked loops (PLLs), etc.

For data transmission, the controller 380 can process (e.g., encodes and modulates) data to be transmitted. The controller 380 can provide one or more output baseband signals to transmit circuits 350. The transmit circuit 350 can amplify, filter, and upconvert each output baseband signal from baseband to RF and provide a modulated signal to a selected PA 360. The transmit circuit 350 can have one or more amplifiers, filters, mixers, matching circuits, oscillators, LO generators, PLLs, etc. The selected PA 360 can amplify the modulated signal and provide an output RF signal having the proper transmit power level to the antenna interface circuit 324. The output RF signal is routed through antenna interface circuit 324 and transmitted via antenna 310.

The LNAs 332, the receive circuit 342, the transmit circuit 352, and the PAs 362 within transceiver 322 can operate in similar manner as the LNAs 330, the receive circuit 340, the transmit circuit 350, and the PAs 360 within transceiver 320. The transceivers 320 and 322 can further have other circuits not shown in FIG. 3. All or a portion of transceivers 320 and 322 may be implemented on one or more analog integrated circuits (ICs), RF ICs (RFICs), mixed-signal ICs, etc. For example, the LNAs 330 and the receive circuit 340 may be implemented on one module, which may be an RFIC, for example. The circuits in the transceiver 320 and the transceiver 322 may also be implemented in other manners.

The controller 380 may perform various functions for wireless device 110. For example, the controller 380 may perform processing for data being received via receive circuits 340 and 342 and data being transmitted via transmit circuits 350 and 352. The controller 380 may control the operation of the various circuits within transceivers 320 and 322. The controller 380 can further selectively control certain aspects of the LNAs 330, 332, and the PAs 360, 362.

A memory 382 may store program codes and data for data processor/controller 380. The controller 380 may be implemented as one or more processors/data processors on one or more application specific integrated circuits (ASICs) and/or other ICs.

The LNAs 330 and the LNAs 332 in FIG. 3 may be implemented in various manners. For example, some circuit designs of the LNAs 330 and the LNAs 332 are described below. LNAs 330 and 332 may also be implemented with transistors of various types. Some exemplary circuit designs of LNAs 330 and 332 with complementary metal oxide semiconductor (CMOS) transistors are described below.

Figure 4:
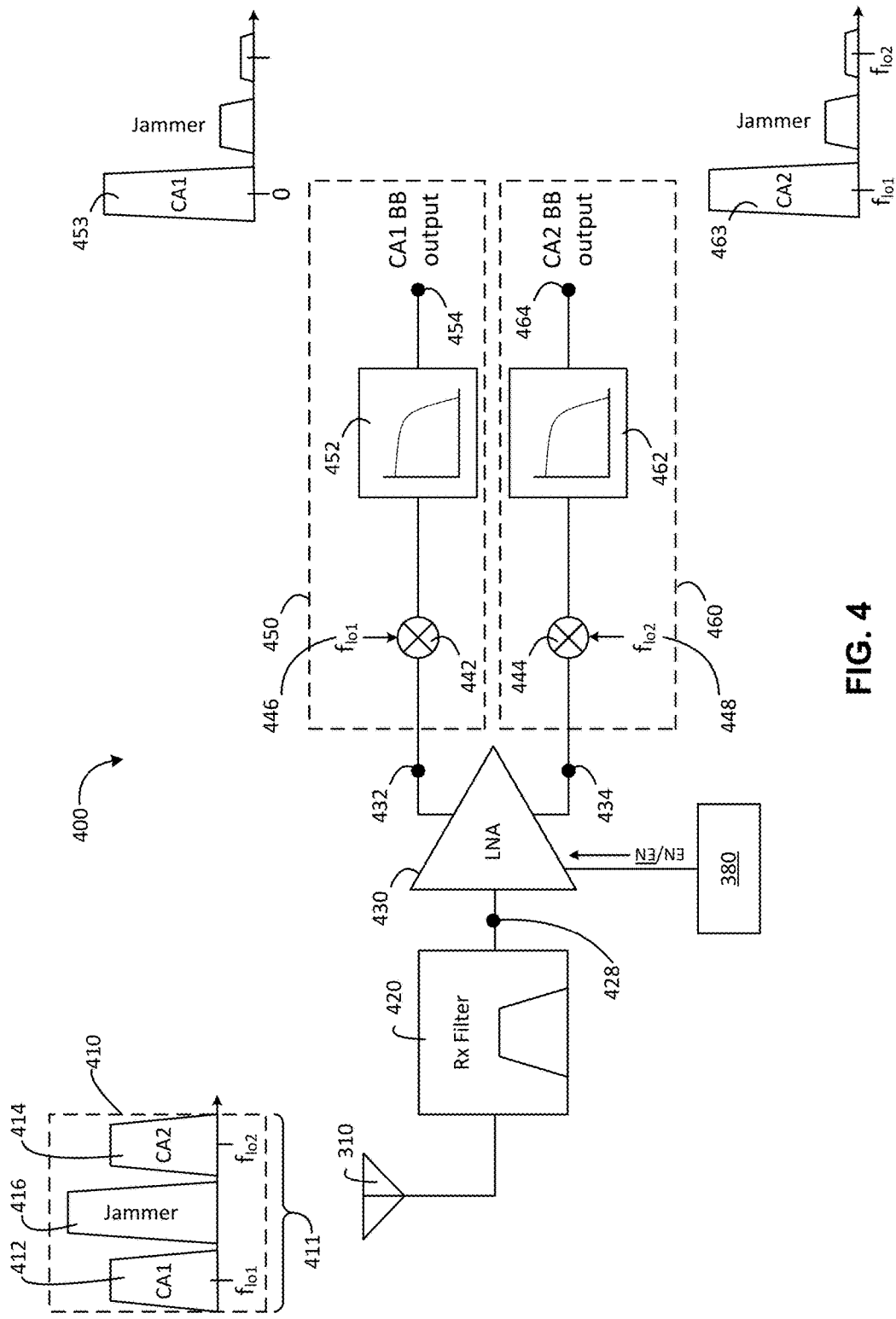
FIG. 4 is a functional block diagram of a non-contiguous intra-band carrier aggregation receiver.

FIG. 4 is a functional block diagram of a non-contiguous intra-band carrier aggregation receiver. A non-contiguous intra-band CA receiver ("CA receiver") 400 can receive an input signal 410. The CA receiver 400 can be part of the device 110, for example, having the features described in connection with FIG. 1 and FIG. 3. In one example, the CA receiver 400 can represent a receive chain from, for example, the antenna 310 through the LNA 330a to the receive circuit 340. For ease of description, certain repetitive features described above are omitted in the description of FIG. 4.

In the CA system (e.g., the system 120) described herein, the BW of several receive (Rx) channels can be combined to boost the throughput of the system. In intra-band non-contiguous CA, combined channels fall within same Rx band but are separated in frequency (e.g., the scenario 280). Thus, according to the scenario 280 (FIG. 2), the input signal 410 can have multiple constituent signals. For example, the input signal 410 can have two carrier aggregated signals CA1 412 and CA2 414 with an interfering signal, referred to herein as a jamming signal or jammer 416, therebetween.

The CA receiver 400 can have an Rx filter 420 tuned to select a frequency band 411 having the desired constituent signals CA1 412 and CA2 414 and reject other signals outside the band (e.g., outside Band X from FIG. 2). The Rx filter 420 can provide an Rx-filtered version of the input signal 410 that can attenuate or minimize signals outside the frequency band 411. In this way, the frequency band 411 can be similar to the Band X of the scenario 280 (FIG. 2), for example. In some cases, the Rx-filtered version of the input signal 410 can be the input signal 410 itself because other signals outside the frequency band 411 have been attenuated.

The CA receiver 400 can have an LNA 430 coupled to the output of the Rx filter 420. The LNA 430 can have an amplifier input 428 (coupled to the output of the Rx filter 420) and two or more outputs corresponding to multiple downconversion chains. In some embodiments, the LNA 430 can have more than two outputs. In some examples, there can be n-number of outputs, where n is an integer. In general, to aggregate n-number of channels (e.g., CAs) there can be n-number of outputs. For example, each of the n-outputs can be separated to n-downconversion and filtering chains. Each chain can then be used to select the desired channel (CA).

The LNA 430 can have a first output 432 coupled to a first downconversion chain 450 (indicated in dashed lines) operable to receive the Rx filtered (e.g., the Rx filter 420) input signal 410 and extract the signal CA1 412. The LNA 430 can also have a second output 434 coupled to a second downconversion chain 460 (indicated in dashed lines) operable to receive the Rx filtered input signal 410 and extract the signal CA2 414. In some examples, the first output 432 and the second output 434 can provide similar the signals, both being are amplified versions of the input signal 410.

In some embodiments, each of the downconversion chains 450, 460 can select one desired constituent signal (e.g., a channel) while attenuating other interfering signals. For example, the first downconversion chain 450 can attenuate (e.g., remove) the signal CA2 414 and the jammer 416. The second downconversion chain 460 can similarly attenuate the signal CA1 412 and the jammer 416. The LNA 430 can be coupled to a first mixer 442 and a second mixer 444. The first mixer 442 can receive a first local oscillator (LO) signal ($f_{LO1}$) 446. The second mixer 444 can also receive a second LO signal ($f_{LO2}$) 448. The first LO signal 446 and the second LO signal 448 can have the same center frequencies, respectively, as the signal CA1 412 and the signal CA2 414 in a direct conversion receiver. In some examples, the LO frequency (e.g., $f_{LO1}$ and $f_{LO2}$) can be based on the input RF frequency of each CA channel. Accordingly, the frequencies can fall anywhere within the receive band (e.g., band X of FIG. 2).

The first mixer 442 and the second mixer 444 can downconvert the input signal 410 based on the first LO signal 446 and the second LO signal 448, respectively. The downconverted signals for each of the first downconversion chain 450 and the second downconversion chain 460 can be input to a respective low pass filter (LPF) 452, 462. The LPF 452 can output baseband data for the signal CA1 412. The LPF 462 can output baseband data for the signal CA2 414. Thus the first downconversion chain 450 can extract first baseband data 453 from the signal CA1 412 for output at a first baseband (BB) output 454. The second downconversion chain 460 can extract second baseband data 463 from the signal CA2 414 for a second BB output 464.

The LNA 430 can further be coupled to the controller 380 (FIG. 3). The controller 380 can activate and deactivate certain aspects or circuits within the LNA 430 in operations related to, for example, impedance matching, gain control, and filtering. The controller 380 can provide certain inputs (e.g., digital inputs) to the LNA 430. The inputs are indicated in FIG. 4 with the inputs from the controller 380 to the LNA 430 labeled "EN/$\overline{EN}$" (read: EN-bar). These aspects are described in connection with the following figures.

The LNA 430 can be implemented, for example, using a common-gate (CG) LNA. A CG LNA can provide wideband input impedance ($Z_{in}$) matching with high linearity. However, increased linearity comes with a tradeoff, often increasing the Noise Figure (NF). A technique referred to as gm-boosting can be used to improve NF. In gm-boosting circuits, an opposite phase signal can be applied from the source to the gate increasing the effective gm and improving NF. The CG LNA can be implemented with NMOS devices only, or with both NMOS and PMOS devices (CMOS). A CMOS implementation may allow more power efficiency by reusing the DC current between the NMOS and PMOS devices and better linearity by NMOS/PMOS nonlinearity cancellation. A gm boosted CG CMOS LNA can use inductive coupling between the source and gate of various NMOS and PMOS devices that comprise the LNA to achieve the gm boosting effect.

In order to support signal splitting for non-contiguous intra-band carrier aggregation as in the LNA 430 using a CG LNA, doubling the transconductance (gm) and splitting the signal between the two (or more) downconversion paths may not function. The input impedance of the CG LNA is proportional to 1/gm and doubling the transconductance can negatively affect input impedance matching. A programmable ratio between the input inductor $L_g$ and source inductors $L_{sn}$ and $L_{sp}$ of a programmable transformer, for example, of the CG LNA can be used to maintain the same input impedance. Certain implementations of the input inductor $L_g$ and source inductors $L_{sn}$ and $L_{sp}$ are shown and described in connection with the following figures. However a programmable transformer can require a larger area and may result in a degraded quality factor due to extra implementation losses. The LNA described below in connection with FIG. 5 addresses these shortcomings by combining multiple high impedance gm stages and multiple low impedance gm stages that allow doubling the gm in intra-CA operation without affecting the input impedance.

Figure 5:
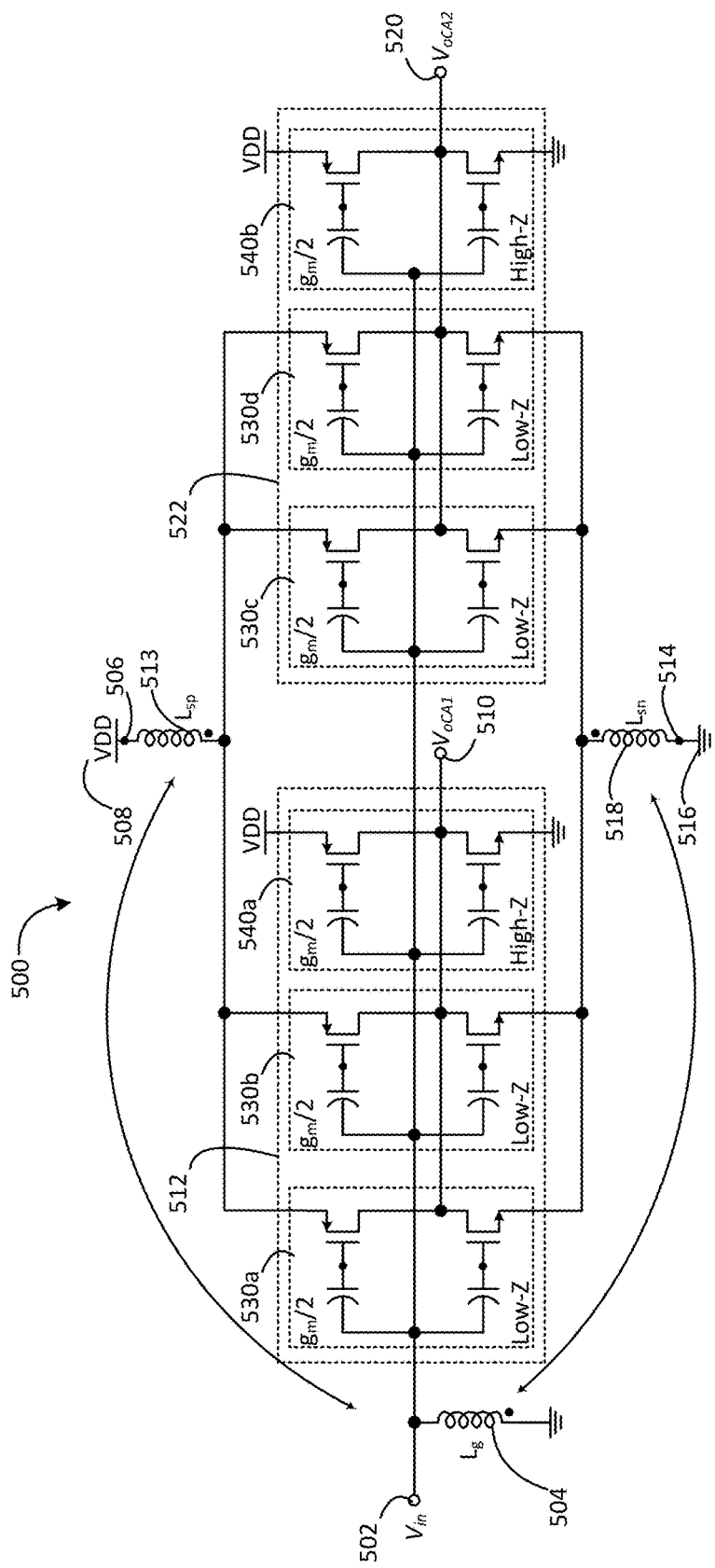
FIG. 5 is a circuit diagram of an embodiment of the intra-band gm-boosted common-gate low noise amplifier of FIG. 4.

FIG. 5 is a circuit diagram of an embodiment of the low noise amplifier of FIG. 4. The LNA 500 can have an amplifier input 502 similar to the amplifier input 428. The amplifier input 502 can receive the input signal 410 (FIG. 4) similar to the circuit 400 (FIG. 4). The LNA 500 can further have a first output 510 for CA1 (e.g., the first downconversion chain 450) and a second output 520 for the signal CA2 (e.g., the second downconversion chain 460). The first output 510 can output a voltage $V_{OCA1}$ representing the voltage values of the signal CA1. Similarly, the second output 520 can output a voltage $V_{OCA2}$ representing the voltage values of the signal CA2.

The LNA 500 can have a positive supply input 506 to receive a positive supply voltage (VDD) 508. The LNA 500 can also have a negative supply input 514 to receive a negative supply voltage 516. The negative supply voltage is shown in this figure as ground, however in some embodiments, the negative supply voltage 516 can comprise a voltage less than the positive supply voltage 508.

The LNA 500 can have an input inductance 504 ($L_g$) coupling the amplifier input 502 to ground. The input inductance $L_g$ 504 can further be magnetically coupled to a PMOS source inductance 513 ($L_{sp}$) and a NMOS source inductance 518 ($L_{sn}$). The PMOS source inductance 513 can couple one or more low impedance (low-Z) gm stages 530 to the positive supply voltage 508. The NMOS source inductance 518 can couple the one or more low-Z gm stages 530 to the negative supply voltage 516. The inductive coupling between these elements can increase the effective gm of each of the low-Z gm stages 530 of the LNA 500. Such magnetic coupling can enable the gm boosting effect of the circuit, by applying opposite phase signals to the gate and source of each gm stage 530, increasing the effective gm.

The input inductance 504, the PMOS source inductance 513, and the NMOS source inductance 518 disclosed herein can be implemented as one three winding transformer, for example, or as separate inductors. One of ordinary skill will appreciate that other inductive loads apart from the inductors shown in FIG. 5 through FIG. 9 can be appropriate without departing from the disclosure.

The LNA 500 can have two LNA or CA chains, referred to herein a first CA chain 512 and a second CA chain 522, shown in dotted lines. The first CA chain 512 (for CA1 412) and the second CA chain 522 (for CA2 414) can be arranged between the amplifier input 502 and the two outputs (e.g., the first output 510 and the second output 520). Each of the LNA chains can have a series of a plurality of gm stages 530, 540. The gm stages 530 (labeled 530a, 530b, 530c, 530d) may be referred to herein as low impedance (low-Z) gm stages, and are labeled accordingly. The low-Z gm stages 530 can be coupled to the PMOS source inductance 513 and the NMOS source inductance 518, which are then magnetically coupled to the input (via, e.g., the input inductance 504). This magnetic coupling can vary the real part of the input impedance, which directly affects input matching.

The one or more gm stages 540 (labeled 540a, 540b) may be referred to herein as high impedance (high-Z) stages 540 and are labeled accordingly. As shown, the high-Z gm stages 540 can be coupled to the supply rails directly and form a capacitive load at the amplifier input 502. For example, each of the high-Z gm stages 540 can have NMOS and PMOS transistors coupled at their respective drains. The source of the PMOS transistor can be coupled to the positive supply voltage 508 while the source of the NMOS transistor can be coupled to the negative supply voltage 516 (e.g., ground). Activating and deactivating (e.g., switching on and off) such a capacitive load does not significantly affect the input impedance. Some embodiments of the LNA 500 can have more than one high-Z gm stage 540 per CA chain.

The low-Z gm stages 530 and the high-Z gm stages 540 can each have a plurality of metal oxide semiconductor (MOS) devices, in either an N-type (NMOS) or P-type (PMOS) configuration. The low-Z gm stages 530 and the high-Z gm stages 540 can also have a plurality of capacitive components (e.g., capacitors). The low-Z gm stages 530 can be configured to provide impedance matching between the amplifier input 502, and the antenna impedance or a front-end driving filter or amplifier. The high-Z gm stages 540 of the LNA 500 can be used to control gain without affecting the input impedance.

In some embodiments, the low-Z gm stages 530 and the high-Z gm stages 540 can provide the LNA 500 flexibility to increase or decrease impedance in an incremental manner for more versatile impedance matching by turning on or off the low-Z gm stages 530 while compensating for the change in gain using the high-Z gm stages 540 to maintain the desired gain.

The LNA 500 can maintain the same input impedance and gain without the need for programmable input transformer. The RF input signal (e.g., the input signal 410) is split between two or more CA branches (e.g., the first CA chain 512 and the second CA chain 522) for intra-CA operation, without affecting the input impedance, so a combined high impedance/low impedance arrangement is employed. For example, the input signal 410 can be applied to the amplifier input 502 and split into the first CA chain 512 and the second CA chain 522 (e.g., the first downconversion chain 450 and the second downconversion chain 460). The low-Z gm stages 530 and the high-Z gm stages 540 can be activated and deactivated (e.g., switched on an off) to maintain matched input impedance while maximizing gain and minimizing NF. The switching of the gm stages 530, 540 is not shown in FIG. 5, but is shown and described in more detail below in connection with FIG. 6.

In either non-CA or Intra-CA modes, a fixed number of low-Z stages 530 can be switched ON to maintain a constant input impedance required for matching at the amplifier input 502, while constant gain can be achieved by implementing (e.g., switching ON) the high-Z stages 540. Assuming two low-Z gm stages 530 are required for impedance matching, the LNA 500 can be configured in different operating modes.

For example, the LNA 500 can be used in a non-CA configuration, and used to resolve baseband data for only one channel. Thus, the input signal (e.g., the input signal 410), having only one channel, can be an input to the LNA 500. The LNA 500 can activate only the first CA chain 512 (e.g., the left half of FIG. 5) or only the second CA chain 522 (e.g., using only the right half of FIG. 5). In this non-CA configuration, the low-Z gm stage 530a and the low-Z gm stage 530b can be switched ON with the remaining gm stages 530, 540 switched OFF. This can allow the LNA 500 to operate in a CA1 mode, providing amplification for only the signal CA1 412. In a similar manner, the LNA 500 can operate in a CA2 mode, where the low-Z gm stage 530c and the low-Z gm stage 530d are switched ON, while the remaining gm stages 530, 540 are switched OFF. This can allow the LNA 500 to provide amplification to only the signal CA2 414.

For Intra-band-CA operation and simultaneous downconversion of both CA1 412 and CA2 414 from the input signal 410, one of the low-Z gm stages 530 in the CA1 chain (e.g., 530a or 530b) and one of the low-Z gm stages 530 in the CA2 chain (e.g., 530c or 530d) are turned ON, while the other low-Z gm stages are turned off, to achieve the same input impedance. The high-Z gm stages 540a and 540b can be turned on to compensate for the drop in gain caused by turning off the other low-Z gm stage 530. In Intra-CA mode, for a certain gain each CA will need a certain gm; half from one low-Z stage 530 and the other half from one high-Z gm stage 540. This arrangement can provide a constant gain on each of the first CA chain 512 and the second CA chain 522, while maintaining constant input impedance at the same time.

A benefit of the switching provided by the LNA 500 is that the same input impedance can be achieved whether operating in a CA mode or a non-CA mode.

Figure 6:
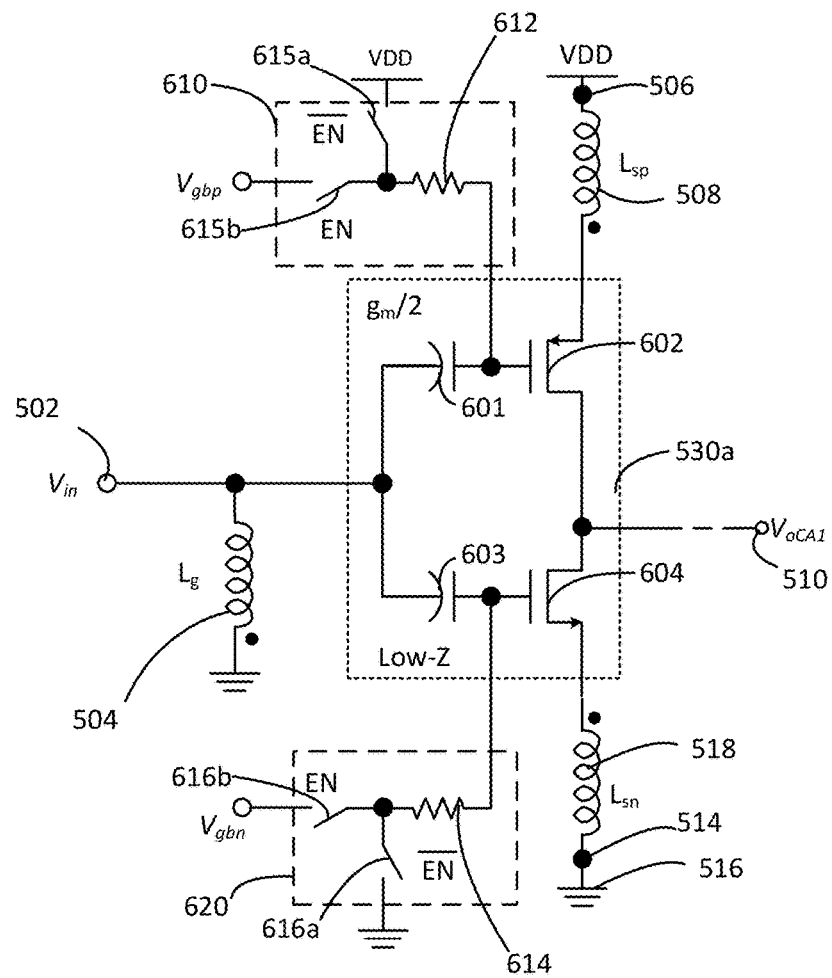
FIG. 6 is a circuit diagram of an embodiment of a portion of the low noise amplifier of FIG. 5.

FIG. 6 is a circuit diagram of an embodiment of a portion of the low noise amplifier of FIG. 5. As noted above, the individual low-Z gm stages 530 and the high-Z gm stages 540 can be individually switched ON or OFF (or "in" or "out" of the circuit) within the LNA 500. This switching can be done to activate or deactivate one or more of the gm stages 530, 540 and provide a gm boost to one of the CA chains 512, 522 or manipulate the input impedance at the amplifier input 502.

As shown in FIG. 6, the low-Z gm stage 530a is shown in isolation. The rest of the components of the LNA 500 are omitted for ease of description, however the switching process described herein can be implemented in connection with the other low-Z gm stages 530 or the high-Z gm stages 540. In some embodiments, the gm stages 530, 540 can have a first switch assembly 610 and a second assembly 620. Only the low-Z gm stage 530a is shown in this figure and is used as a primary example. However the concepts and descriptions of the switching functions are equally applicable to an embodiment of the first switch assembly 610 and the second assembly 620 for use in one of the high-Z gm stages 540. The first switch assembly 610 and the second switch assembly 620 can have generally the same components for activating or deactivating, for example, the low-Z gm stage 530a (or, e.g., the high-Z gm stages 540). The switching can be accomplished via a bias voltage applied to the gates of the MOS devices within the low-Z and high-Z gm stages (e.g., the low-Z gm stage 530a, as shown).

In some embodiments, a bias voltage $V_{gbp}$ can be switchably applied to the gate of a MOS device 602 via the first switch assembly 610. The gate of the MOS device 602 can further be coupled to the amplifier input 502. A first capacitance 601 can also be coupled between the amplifier input 502 and the gate of the MOS device 602. The first switch assembly 610 can be coupled between the first capacitance 601 and the MOS device 602.

Similarly, a NMOS gate bias voltage $V_{gbn}$ can be switchably applied to the gate of a MOS device 604 via the second switch assembly 620. The gate of the MOS device 604 can be coupled to the amplifier input 502. A second capacitance 603 can also be coupled between the amplifier input 502 and the MOS device 604. The second switch assembly 620 can be coupled between the second capacitance 603 and the MOS device 604. The first output 510 (FIG. 5) can further be coupled to the drains of the MOS device 602 and the MOS device 604.

In some embodiments, the gm stages 530, 540 can each have two transistors (e.g., the MOS devices 602, 604). The gates of the two transistors can be coupled to the amplifier input 502 (e.g., $V_{in}$ or the input signal 410). Additionally, the output (e.g., the first output 510) can be coupled to the drains of the transistors (e.g., the MOS devices 602, 604). A second output (e.g., the second output 520) can also be coupled between drains of the MOS devices 602, 604 of a second stage (e.g., one of the low-Z gm stages 530 or the high-Z gm stages 540). The outputs (e.g., the first output 510 and the second output 520) may be for separate carriers (e.g., CA1, CA2) for use with carrier aggregation. There may be a first and second plurality of gm stages 530, 540 coupled to each output, and certain of the gm stages 530, 540 within a set may have low impedance, while certain others may have high impedance, as described above.

The first switch assembly 610 and the second switch assembly 620 can also receive positive and negative supply voltages, as above (e.g., ground/$V_{SS}$ and $V_{DD}$). These supply voltages can also be switchably coupled to the gates of the MOS device 602, 604.

The first switch assembly 610 and the second switch assembly 620 can also couple the bias voltages (e.g., $V_{gbp}$, $V_{gbn}$) to the gates of the MOS devices 602, 604 through a resistive element 612, 614. The resistive elements 612, 614 can prevent the direct current (DC) bias voltages from affecting the RF input. For example, the voltage at the gates of the MOS devices 602, 604 is the RF input shifted by the DC bias. To achieve this without the DC voltage affecting the RF input or vice versa, a large resistor (e.g., the resistive elements 612, 614) and a capacitor (e.g., first capacitance 601 and the second capacitance 603) can be implemented. The circuit operates as a high pass filter from the amplifier input 502 to the gate of the MOS devices 602, 604, passing the input RF signal and blocking DC voltage. Additionally, the circuit operates as a low pass filter from the bias voltage ($V_{gbn}$, $V_{gbp}$) to the gates of the MOS devices 602, 604, passing the DC voltage and blocking any high frequency noise.

In some embodiments, the gm stages (e.g., the low-Z gm stage 530a) can have PMOS or NMOS devices as the MOS devices 602, 604. As shown, the MOS device 602 is PMOS and the MOS device 604 is NMOS, however one of ordinary skill will appreciate that this is not limiting.

In some examples, an NMOS device (e.g., the MOS device 604) with a gate biased such that the gate bias voltage ($V_{gbn}$) is greater than the threshold voltage, $V_{thn}$, (e.g., $V_{gbn} > V_{thn}$) can switch ON. That is, transconductance (gm) will increase to a non-negligible value greater than zero. In other circumstances where gate is grounded transconductance will be zero, or at least approach zero and/or be negligible.

In another example, a PMOS device (e.g., the MOS device 602) with a gate biased such that the gate bias voltage ($V_{gbp}$) is less than the difference between the supply voltage (VDD) and the threshold voltage, $V_{gbp}$, (e.g., $V_{gbp} < V_{DD} - |V_{thp}|$) will be switched ON. Conversely, where the gate is coupled to the supply voltage $V_{DD}$, the PMOS device will switch OFF.

In some embodiments, the first switch assembly 610 can have first switches 615 (615a, 615b) and the second switch assembly 620 can have second switches 616 (616a, 616b). The first switches 615 and the second switches 616 can selectively connect or disconnect various bias voltages and supply voltages to activate and/or deactivate one or more gm stages 530, 540 (e.g., the low-Z gm stage 530a, as shown).

The first switches 615 and the second switches 616 can receive an input or command (e.g., EN and $\overline{EN}$) from the controller 380, for example, to activate or deactivate. The commands can be in the form of a digital input, for example. The digital inputs are shown as the digital inputs EN and $\overline{EN}$, similar to that shown in FIG. 4. In some embodiments the switching of the first switch assembly 610 and the second switch assembly 620 can be done based on the operation mode and required gain of the LNA 500. In some examples the gain and operation mode are determined at the system level. The system (e.g., the controller 380) can determine the requirements for non-CA or Intra-CA operating modes. The controller 380 can further determine necessary gain required from the LNA 500.

The controller 380 can thus be coupled to the first CA chain 512 and the second CA chain 522, their respective individual gm stages 530, 540. The controller 380 can further selectively activate and deactivate one or more of the plurality of transconductance stages (e.g., the gm stages 530, 540) adjust (e.g., increase or decrease) transconductance and match an input impedance at the amplifier input.

The controller 380 can then configure the first switches 615 and the second switches 616 for each gm stage 530, 540 using the signals EN and $\overline{EN}$ to the first switch assembly 610 and the second switch assembly 620. For example, when enabled (EN=1 and $\overline{EN}$=0) the gates of the MOS devices 602, 604 are connected to the bias voltages $V_{gbn}$ and $V_{gbp}$, respectively, and the gm stage (e.g., the low-Z gm stage 530a) is switched ON. Similarly, when disabled (EN=0 and $\overline{EN}$=1) the gates of the MOS devices 602, 604 are coupled to the supply voltage $V_{DD}$ and ground, respectively. The gm stage is then switched OFF. The values of 0 and 1 are used, for example, to represent digital low and digital high signals, respectively.

It is noted that the low-Z gm stages 530 and the high-Z gm stages 540 have different configurations with respect to the MOS device 602 and the MOS device 604 and their respective couplings to the positive supply input 506 and the negative supply input 514; however, the connections to the first switch assembly 610 and the second switch assembly 620 can be similar and thus apply in a similar manner as described herein.

Figure 7:
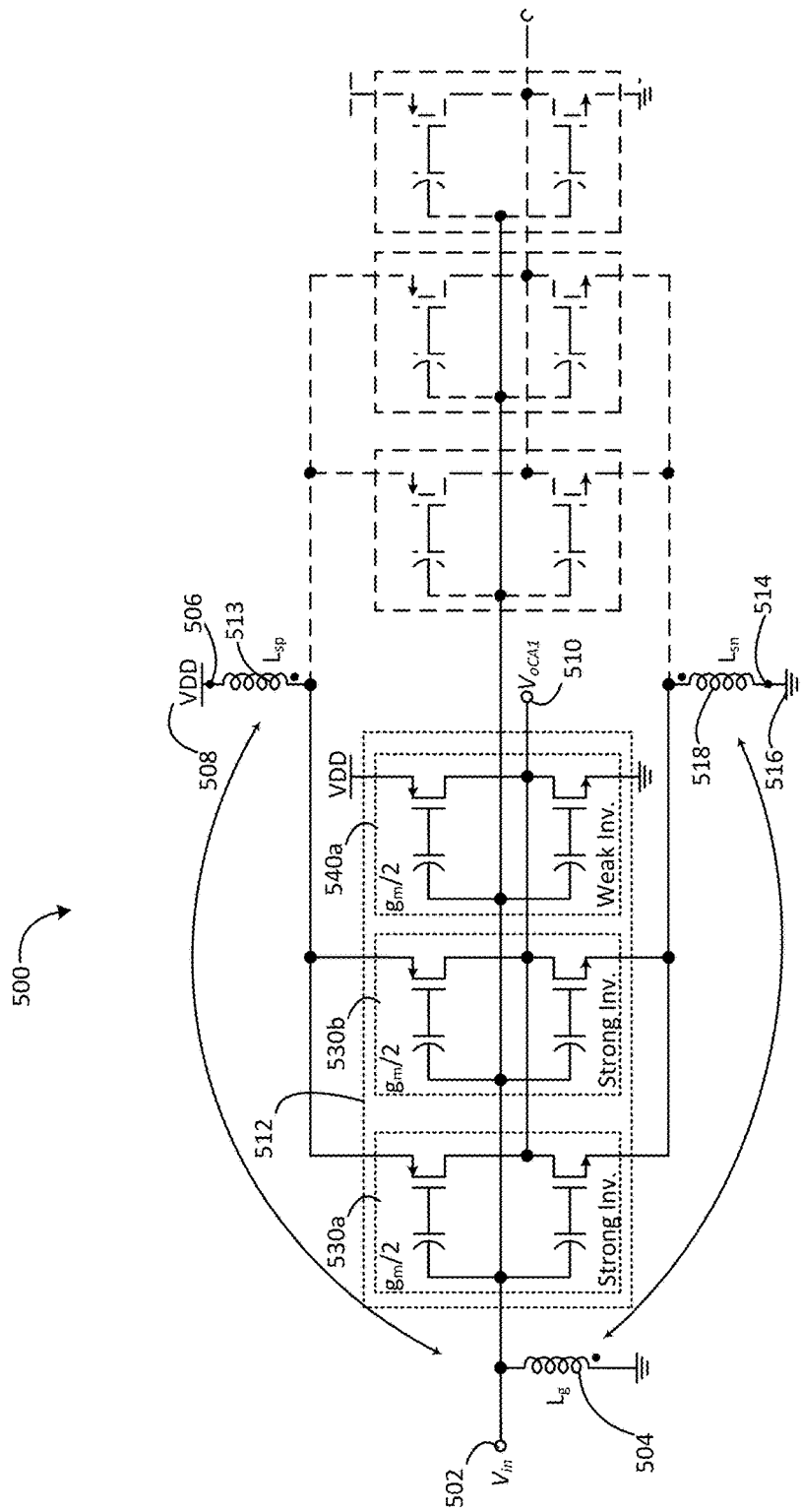
FIG. 7 is a circuit diagram of another embodiment of the low noise amplifier of FIG. 5.

FIG. 7 is a circuit diagram of another embodiment of the low noise amplifier of FIG. 5. In another embodiment of the LNA 500, the first CA chain 512 can be used for modified derivative superposition (MDS) linearization, providing better linearity. In such an embodiment, only one of the CA chains 512, 522 may be used. For example, as shown the first CA chain 512 is switched ON, and the second CA chain 522 is switched OFF. This arrangement can allow a non-CA mode of operation for the LNA 500. In such an embodiment, the high-Z gm stage 540a can be biased in a weak inversion, while the low-Z stages 530a, 530b can be biased in strong inversion. The third order nonlinearity generated by the strong inversion biased gm and that of the weak inversion one are out of phase, and with proper sizing can be made to be equal in magnitude, thus cancelling at the output achieving higher $3^{rd}$ order linearity.

Figure 8:
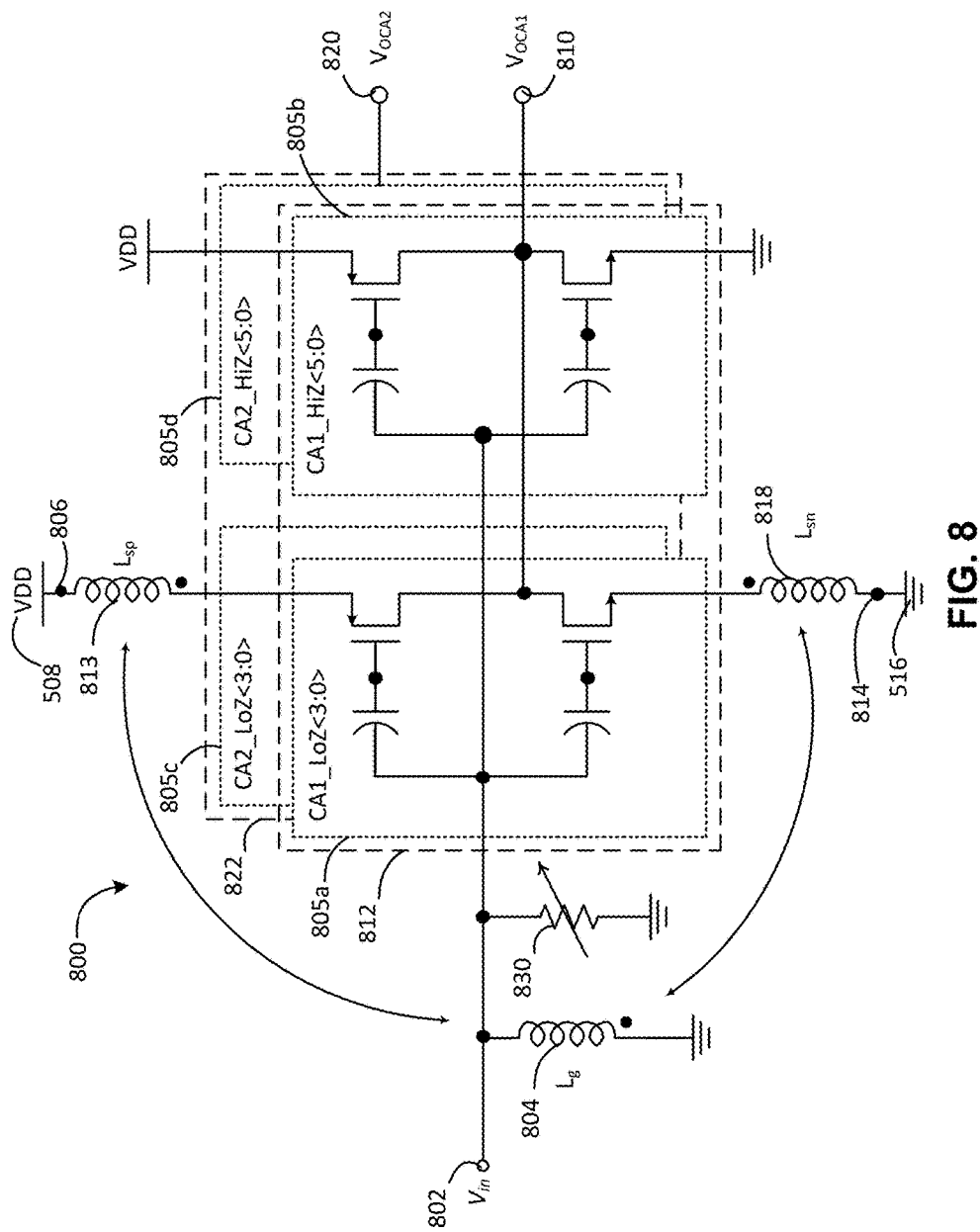
FIG. 8 is a circuit diagram of another embodiment of the low noise amplifier of FIG. 4.

FIG. 8 is a circuit diagram of another embodiment of the low noise amplifier of FIG. 4. In some embodiments, an LNA 800 can be implemented as the LNA 430 (FIG. 4). The LNA 800 can have an amplifier input 802 to receive, for example, the input signal 410. The LNA 800 can further have multiple outputs, a first output 810 and a second output 820, similar to the LNA 430 (from the CA receiver 400) and the LNA 500.

The LNA 800 can have an input inductance 804 coupling to the amplifier input 802 to ground, for example. The LNA 800 can also have a positive supply input 806 to receive the positive supply voltage ($V_{DD}$) 508 (FIG. 5) via a PMOS supply inductance 813 ($L_{sp}$). The LNA 800 can also have a negative supply input 814 to receive the negative supply voltage 516 (e.g., ground voltage or a negative voltage) via a NMOS source inductance 818 ($L_{sn}$). The LNA 800 can be similar to the LNA 500 have similar components.

The LNA 800 can have a plurality of gm stages 805 (labeled 805a, 805b, 805c, 805d) similar to the gm stages 530, 540. As shown, the gm stages 805a, 805c are low-Z (low impedance) and the gm stages 805b, 805d are high-Z (high impedance).

The LNA 800 can have multiple CA chains, such as a first CA chain 812 and a second CA chain 822 similar to the LNA 500. While not specifically shown in this figure, the second CA chain 822 can have similar connections between the gm stages 805c, 805d as the first CA chain 812 has between the gm stages 805a, 805b. The LNA 800 can further have additional CA chains (e.g., a third or fourth CA chain) as required by a number of CA signals within, for example, the input signal 410.

The LNA 800 can be similar to the LNA 500 (FIG. 5), providing additional gain control. In the LNA 800, the high-Z and low-Z gm stages 805 are further split into smaller, parallel gm stages. For example, the low-Z gm stages 805a, 805c can be split into four parallel stages and the high-Z is split to six parallel stages, for example, but it can be any number of gm stages, in general. Only the first CA chain 812 and the second CA chain 822 are shown for ease of description, however additional CA chains are possible, as described above. As shown in FIG. 8, the low-Z gm stages 805a, 805c are labeled CA1_LoZ<3:0> indicating that there are four low-Z gm stages numbered 0 to 3. Similarly, the high-Z gm stages 805b, 805d are labeled CA1_HiZ<5:0> indicates six parallel stages numbered 0 to 5. This allows for adjusting the gain in smaller increments by turning on/off the different stages.

The gm stages 805 can have switches (e.g., the first and second switch assemblies 610, 620 of FIG. 6) such that they can be switched ON and OFF as described in connection with FIG. 6. The first switch assembly 610 and the second switch assembly 620 are again omitted in this figure for ease of description.

In some embodiments, the LNA 800 can provide programmable gain control for CA. In some examples, the parallel arrangement of the first CA chain 812 and the second CA chain 822, in addition to third and fourth CA chains (not shown) can provide increased flexibility in gain programmability. Such an arrangement can also provide lower gain than the arrangement of the LNA 500 (FIG. 5). For example, the LNA 800 can scale current while maintaining adequate $V_{gs}$ for increased linearity in lower gain modes.

In an embodiment, an LNA (e.g., the LNA 800) can provide different gain modes, in for example, high, moderate, and low gain. When the received signal (e.g., the signal 412) is very weak, the LNA is operated in the highest gain mode. As signal strength increases, gain can be reduced. This can be accomplished by implementing one large gm stage, and decrease current for lower gain modes to reduce gain. However, decreasing the current can reduce $V_{gs}$, which can then degrade linearity. In another implementation the large gm stages can be split into smaller parallel cells, wherein each cell can be turned off independently to reduce gain. This way the $V_{gs}$ of the ON stages remains fixed, maintaining linearity while lowering the gain and reducing current.

In some embodiments, the LNA 800 can further have a programmable resistance 830 coupled to the amplifier input 802 and in parallel with the input inductance 804 ($L_g$) to ground. The programmable resistance 830 can be a resistive element having an adjustable resistance or impedance. In some implementations it can be a variable resistor, potentiometer, rheostat, or other circuitry providing an adjustable resistance. The programmable resistance 830 can provide variable gain control, by allowing adjustable or variable real impedance. The adjustable real-impedance can allow the controller 380 to maintain impedance matching at low gain levels. The gm stages 805 can be switched ON or OFF as needed while the programmable resistance 830 can aid in impedance matching. This can compensate for the reduction in impedance due to the gm drop. Gain control can be based on the current provided to the circuit, and the number of gm stages 805 that are switched on.

Figure 9:
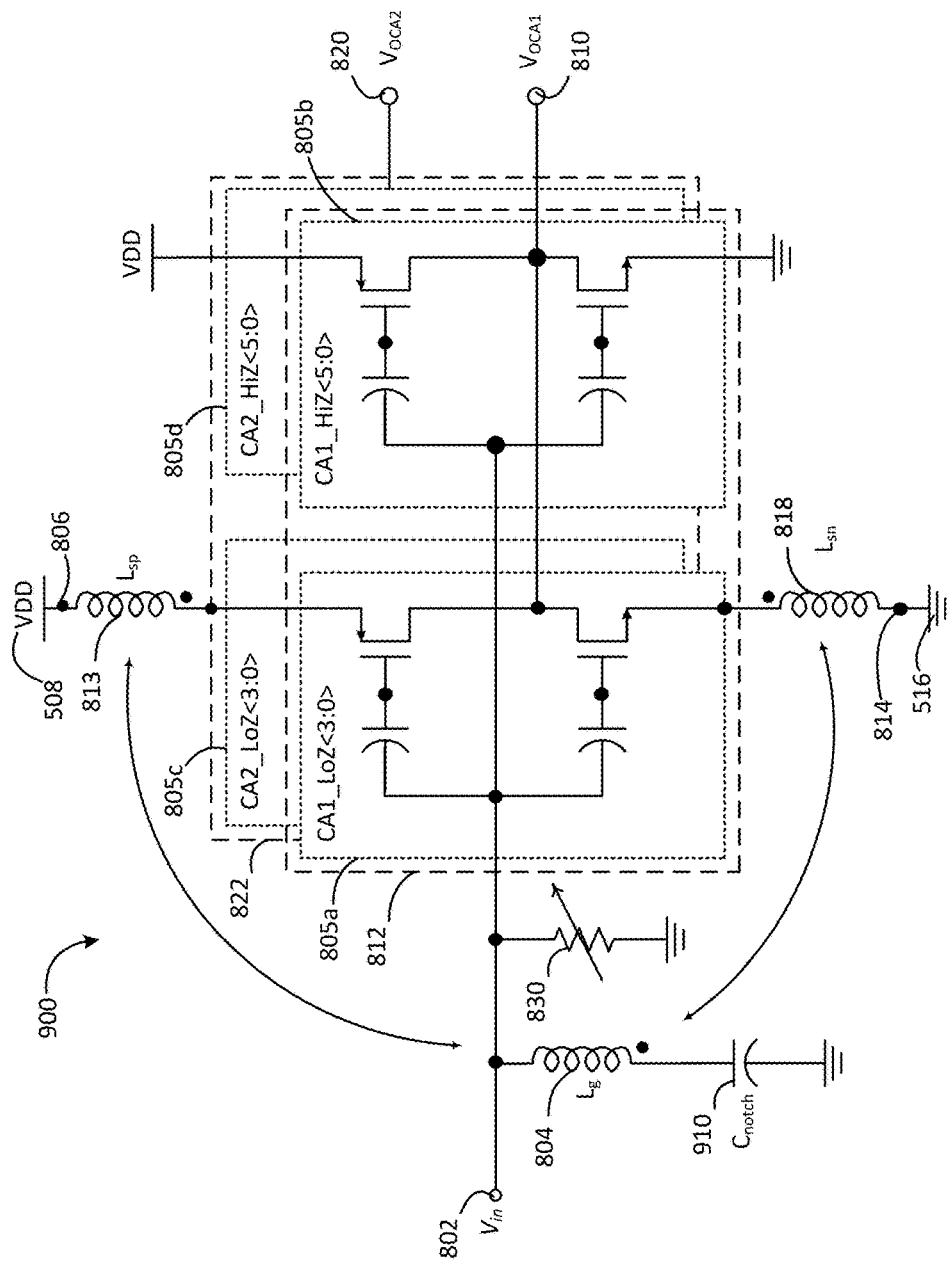
FIG. 9 is a circuit diagram of another embodiment of the low noise amplifier of FIG. 4.

FIG. 9 is a circuit diagram of another embodiment of the low noise amplifier of FIG. 8. In some embodiments, an LNA 900 can be implemented for the LNA 430 (FIG. 4). The LNA 900 can be similar to the LNA 800 having the same input, outputs, inductances, and various internal connections. For example, like numbers refer to like components of the LNA 800 and the LNA 900. The LNA 900 can have an amplifier input 802 to receive, for example, the input signal 410. The LNA 800 can further have multiple outputs, e.g., the first output 810 and the second output 820, similar to the LNA 800.

The LNA 900 can further have a notch capacitor 910 ($C_{notch}$). The notch capacitor 910 can be coupled in series with the input inductance 804 to ground. The notch capacitor 910 can further be coupled between the input inductance 804 and ground. The input inductance 804 and the notch capacitor 910 can form a LC circuit. The LC circuit can create a series resonance at low frequencies that forms a notch in the transfer function from the input 802 to the first output 810 and the second output 820. For example, low frequency can refer to frequencies lower than the desired RF signal (e.g., the signal CA1 412). A series resonance can change from capacitive to inductive, but at the normal frequency of operation (e.g., the frequency of desired RF signal) it remains inductive. Such a notch can provide filter for certain out of band jammers relaxing the linearity requirement of the receiver at these frequencies.

Those of skill will appreciate that the various illustrative blocks described in connection with the embodiments disclosed herein can be implemented in various forms. Some blocks have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a block or step is for ease of description. Specific functions or steps can be moved from one block or distributed across to blocks without departing from the present disclosure.

The above description of the disclosed embodiments is provided to enable any person skilled in the art to make or use the present disclosure. Various modifications to these embodiments will be readily apparent to those skilled in the art, and the generic principles described herein can be applied to other embodiments without departing from the spirit or scope of the present disclosure. Thus, it is to be understood that the description and drawings presented herein represent a presently preferred embodiment of the present disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

The invention claimed is:

1. A device for amplifying signals comprising:
    an amplifier input operable to receive an input signal;
    a first carrier aggregation (CA) chain comprising a first plurality of transconductance stages having shared inputs coupled to the amplifier input, the first plurality of transconductance stages comprising at least a high impedance stage and a low impedance stage;
    a first CA output coupled to shared outputs of the first plurality of transconductance stages;
    a second CA chain comprising a second plurality of transconductance stages having shared inputs coupled to the amplifier input, the second plurality of transconductance stages comprising at least a high impedance stage and a low impedance stage; and
    a second CA output coupled to shared outputs of the second plurality of transconductance stages.

2. The device of claim 1, further comprising a controller coupled to the first CA chain and the second CA chain, and operable to selectively activate and deactivate one or more of the first plurality of transconductance stages and one or more of the second plurality of transconductance stage.

3. The device of claim 2, wherein each transconductance stage of the first plurality of transconductance stages and the second plurality of transconductance stages are coupled to a first switch assembly and a second switch assembly, the first switch assembly and the second switch assembly further being coupled to the controller and configured to receive one or more signals from the controller to activate and deactivate a respective transconductance stage.

4. The device of claim 1, wherein each transconductance stage of the first plurality of transconductance stages comprises a first pair of transistors, the first pair of transistors having first gates and first drains, wherein the first gates are coupled to the amplifier input and the first drains are coupled to the first CA output, and
    wherein each transconductance stage of the second plurality of transconductance stages comprise a second pair of transistors, the second pair of transistors having second gates and second drains, wherein the second gates are coupled to the amplifier input and the second drains are coupled to the second CA output.

5. The device of claim 4, wherein the low impedance stage of the first plurality of transconductance stages and the second plurality transconductance stages comprises a degeneration inductor coupled to a source of one of the transistors of the first pair or the second pair of transistors; and
    wherein the high impedance stage of the first plurality of transconductance stages and the second plurality transconductance stages lacks a degeneration inductor coupled a source of one of the first pair or the second pair of transistors of the pair of transistors.

6. The device of claim 1, wherein a first desired signal and a second desired signal of the input signal are received in a single frequency band in a non-contiguous intra-band CA mode.

7. The device of claim 1, wherein the first plurality of transconductance stages and the second plurality of transconductance stages comprise two low impedance stages and one high impedance stage.

8. The device of claim 1, further comprising:
    an input inductance coupled between the amplifier input and ground;
    a first supply inductance coupling a first side of the first CA chain and the second CA chain to a positive supply voltage; and
    a second supply inductance coupling a second side of the first CA chain and the second CA chain to a negative supply voltage,
    wherein the input inductance is inductively coupled to the first supply inductance and the second supply inductance to increase transconductance of one or more activated transconductance stages of the first plurality of transconductance stages and the second plurality of transconductance stages.

9. The device of claim 8, further comprising a programmable resistance coupling the amplifier input to ground in parallel with the input inductance,
    wherein the first plurality of transconductance stages comprises a first low impedance stage and a first high impedance stage and the second plurality of transconductance stages comprises a second low impedance stage and a second high impedance stage, and
    wherein the first CA chain is coupled in parallel with the second CA chain to provide programmable gain control.

10. The device of claim 9, further comprising an out of band notch filter having a notch capacitor coupled in series between the input inductance and ground, operable to produce a series resonance to reject one or more interfering signals.

11. A method for amplifying signals comprising:
    receiving, at an amplifier input, an input signal having a first desired signal on a first carrier and a second desired signal on a second carrier;

first activating, by a controller, one or more transconductance stages of a first plurality of transconductance stages in a first carrier aggregation (CA) chain for use with the first carrier;

second activating, by the controller, one or more transconductance stages of a second plurality of transconductance stages in a second CA chain for use with the second carrier;

outputting at a first CA output coupled to the first CA chain, the first desired signal; and outputting at a second CA output coupled to the second CA chain, the second desired signal.

12. The method of claim 11 further comprising selectively deactivating, by the controller, one or more of the first plurality of the first plurality of transconductance stages and the second plurality of transconductance stages based on the outputting.

13. The method of claim 11, wherein each transconductance stage of the first plurality of transconductance stages comprises a first pair of transistors, the first pair of transistors having first gates and first drains, wherein the first gates are coupled to the amplifier input and the first drains are coupled to the first CA output, and wherein each transconductance stage of the second plurality of transconductance stages comprise a second pair of transistors, the second pair of transistors having second gates and second drains, wherein the second gates are coupled to the amplifier input and the second drains are coupled to the second CA output.

14. The method of claim 11, wherein the first desired signal and the second desired signal are received at the amplifier input in a single frequency band in a non-contiguous intra-band CA mode.

15. The method of claim 11, wherein input impedance has an inverse relationship with a change in transconductance of the first CA chain and the second CA chain.

16. The method of claim 11, wherein each transconductance stage of the first plurality of transconductance stages and the second plurality of transconductance stages are coupled to a first switch assembly and a second switch assembly, the first switch assembly and the second switch assembly further being coupled to the controller and configured to receive one or more signals from the controller to activate and deactivate a respective transconductance stage.

17. The method of claim 11, wherein the first plurality of transconductance stages and the second plurality of transconductance stages comprise two low impedance stages and one high impedance stage.

18. The method of claim 11 further comprising deactivating, by the controller, the second plurality of transconductance stages in the second CA chain for use with modified derivative superposition in a single frequency CA mode.

19. The method of claim 11, further comprising:
coupling an input inductance between the amplifier input and ground;
coupling a supply inductance between a first side of the first CA chain and the second CA chain to a positive supply voltage; and
coupling a second supply inductance between a second side of the first CA chain and the second CA chain to a negative supply voltage,
inductively coupling the input inductance to the supply inductance and the second supply inductance to increase transconductance of one or more activated transconductance stages of the first plurality of transconductance stages and the second plurality of transconductance stages.

20. The method of claim 19, further comprising coupling a programmable resistance between the amplifier input and ground in parallel with the supply inductance,
wherein the first plurality of transconductance stages comprises a first low impedance stage and a first high impedance stage and the second plurality of transconductance stages comprises a first low impedance stage and a first high impedance stage, and
wherein the first CA chain is coupled in parallel with the second CA chain to provide programmable gain control.

21. The method of claim 20, further comprising:
coupling a notch capacitor in series between the input inductance and ground to form an out of band notch filter; and
generating, with the out of band notch filter, a series resonance to reject one or more interfering signals.

22. An apparatus for amplifying signals comprising:
means for receiving an input signal having a first desired signal on a first carrier and a second desired signal on a second carrier;
means for selectively activating one or more transconductance stages of a first plurality of transconductance stages in a first carrier aggregation (CA) chain for use with the first carrier and one or more transconductance stages of a second plurality of transconductance stages in a second CA chain for use with the second carrier;
means for matching, based on the means for selectively activating, an input impedance of the first CA chain and the second CA chain;
means for providing the first desired signal based on the means for matching; and
means for providing the second desired signal based on the means for matching.

23. The apparatus of claim 22, wherein each transconductance stage of the first plurality of transconductance stages comprises a first pair of transistors, the first pair of transistors having first gates and first drains, wherein the first gates are coupled to the amplifier input and the first drains are coupled to the means for providing the first desired signal, and wherein each transconductance stage of the second plurality of transconductance stages comprise a second pair of transistors, the second pair of transistors having second gates and second drains, wherein the second gates are coupled to the amplifier input and the second drains are coupled to the means for providing the second desired signal.

24. The apparatus of claim 22, further comprising:
first means for inductively coupling the means for receiving an input signal to means for receiving a positive supply voltage;
second means for inductively coupling the means for receiving an input signal to means for receiving a ground supply voltage;
means for increasing transconductance of the first CA chain and the second CA chain based on the first means for inductively coupling and the second means for inductively coupling.

25. The apparatus of claim 24, further comprising means for adjusting a resistance between the means for receiving an input signal and ground,
wherein the first plurality of transconductance stages comprises a first low impedance stage and a first high impedance stage and the second plurality of transconductance stages comprises a first low impedance stage and a first high impedance stage, and wherein the first CA chain is coupled in parallel with the second CA chain to provide programmable gain control.

26. A device for amplifying a first desired signal and a second desired signal, the device comprising:
an input configured to receive an input signal;
a plurality of transconductance stages arranged in a first carrier aggregation (CA) chain and a second CA chain, each transconductance stage of the plurality of transconductance stages having a pair of transistors, each transistor of the pair of transistors having
a gate coupled to the input, and
a drain, the drain of each transistor in each transconductance stage of the first CA chain coupled to a first CA output, and the drain of each transistor in each transconductance stage of the second CA chain coupled to a second CA output.

27. The device of claim 26, further comprising a controller coupled to each transconductance stage of the plurality of transconductance stages and configured to match an input impedance of each of the first CA chain and the second CA chain based on selectively activating and deactivating one or more of the plurality of transconductance stages, wherein each transconductance stage is configured as one of high impedance and low impedance.

28. The device of claim 27, further comprising:
an input inductance coupled between the input and ground;
a supply inductance coupling a first side of the first CA chain and first side of the second CA chain to a positive supply voltage; and
a second supply inductance coupling a second side of the first CA chain and a second side of the second CA chain to a negative supply voltage,
wherein the input inductance is inductively coupled to the supply inductance and the second supply inductance to increase transconductance of one or more activated transconductance stages of the first plurality of transconductance stages and the second plurality of transconductance stages.

29. The device of claim 28, further comprising a programmable resistance coupling the input to ground in parallel with the supply inductance,
wherein the plurality of transconductance stages comprises a first low impedance stage and a first high impedance stage and the second plurality of transconductance stages comprises a first low impedance stage and a first high impedance stage, and
wherein the first CA chain is coupled in parallel with the second CA chain to provide programmable gain control.

30. The device of claim 29, further comprising an out of band notch filter having a notch capacitor coupled in series between the input inductance and ground, operable to produce a series resonance to reject one or more interfering signals.

* * * * *